(12) United States Patent
Hashimoto (10) Patent No.: US 8,773,144 B2
(45) Date of Patent: Jul. 8, 2014

(54) AVALANCHE BREAKDOWN TEST APPARATUS

(75) Inventor: Kenji Hashimoto, Saitama (JP)

(73) Assignee: Advantest Corporation, Tokyo (JP)

( * ) Notice: Subject to any disclaimer, the term of this patent is extended or adjusted under 35 U.S.C. 154(b) by 385 days.

(21) Appl. No.: 13/253,971

(22) Filed: Oct. 6, 2011

(65) Prior Publication Data

US 2012/0268138 A1   Oct. 25, 2012

(30) Foreign Application Priority Data

Dec. 15, 2010   (JP) ................................ 2010-279625

(51) Int. Cl.
  *G01R 31/26* (2014.01)
  *G01R 31/00* (2006.01)
(52) U.S. Cl.
  USPC ....... 324/555; 324/500; 324/522; 324/750.01
(58) Field of Classification Search
  CPC ........................... G01R 31/261; G01R 31/2637
  USPC .................................................. 324/500–559
  See application file for complete search history.

(56) References Cited

U.S. PATENT DOCUMENTS

| | | | | |
|---|---|---|---|---|
| 6,396,298 B1 * | 5/2002 | Young et al. | ............. | 324/762.09 |
| 7,298,150 B2 * | 11/2007 | Amanuma | .................... | 324/522 |
| 2011/0298630 A1 * | 12/2011 | Kiyokawa et al. | ......... | 340/686.1 |
| 2012/0153974 A1 * | 6/2012 | Hashimoto | .............. | 324/750.01 |
| 2012/0182031 A1 * | 7/2012 | Tokumoto et al. | ........ | 324/750.01 |

FOREIGN PATENT DOCUMENTS

| | | | | |
|---|---|---|---|---|
| JP | 2007-33042 A | | 2/2007 | |
| JP | 2007-333710 | * | 12/2007 | ........... G01R 31/319 |
| JP | 2007-333710 A | | 12/2007 | |
| JP | 2009-204329 A | | 9/2009 | |

OTHER PUBLICATIONS

Office Action for Japanese Patent Application No. 2010-279625, issued by the Japanese Patent Office on Sep. 24, 2013.

\* cited by examiner

*Primary Examiner* — Melissa Koval
*Assistant Examiner* — Emily Chan (57) ABSTRACT

To detect whether energy accumulated in an inductive load section has been discharged. Provided is a test apparatus that tests a device under test, comprising a power supply section that generates a power supply voltage to be supplied to the device under test; an inductive load section that is provided in a path between the power supply section and the device under test; a housing section that houses a substrate that includes at least the inductive load section; and a lock maintaining section that keeps an opening/closing section, which allows an operator to access the substrate within the housing section, in a locked state when a voltage at a predetermined position on the substrate is greater than a set voltage.

16 Claims, 6 Drawing Sheets

AVALANCHE BREAKDOWN TEST APPARATUS

BACKGROUND

1. Technical Field

The present invention relates to a test apparatus.

2. Related Art

When manufacturing a semiconductor switch, such as an IGBT, that switches current flowing though an inductive load, an avalanche breakdown test is performed. Patent Document 1 describes a test apparatus that performs an avalanche breakdown test.

Patent Document 1: Japanese Patent Application Publication No. 2007-33042

In this test apparatus, the opening/closing section of the chassis is kept locked, which prevents the user from accessing the substrate during testing, for example. Furthermore, with this test apparatus used for the avalanche breakdown test, since energy is accumulated in the conductive load during testing, the opening/closing section of the chassis is kept locked until the accumulated energy is discharged. Accordingly, with this test apparatus, it is preferable that the locked state can be maintained while easily and accurately detecting whether the energy accumulated in the inductive load has been discharged.

SUMMARY

In order to solve the above problems, according to a first aspect of the present invention, provided is a test apparatus that tests a device under test, comprising a power supply section that generates a power supply voltage to be supplied to the device under test; an inductive load section that is provided in a path between the power supply section and the device under test; a housing section that houses a substrate that includes at least the inductive load section; and a lock maintaining section that keeps an opening/closing section, which allows an operator to access the substrate within the housing section, in a locked state when a voltage at a predetermined position on the substrate is greater than a set voltage.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
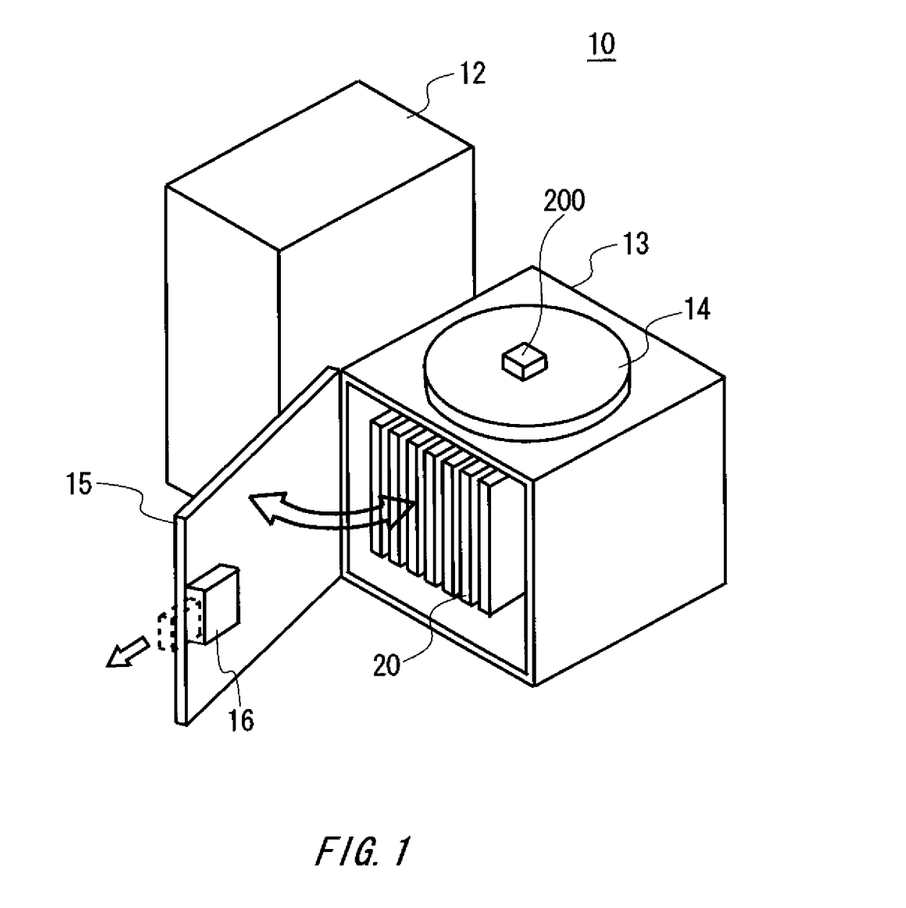
FIG. 1 shows an exemplary external configuration of a test apparatus 10 according to an embodiment of the present invention.

FIG. 1 shows an exemplary external configuration of a test apparatus 10 according to an embodiment of the present invention. The test apparatus 10 of the present embodiment tests the avalanche breakdown voltage of a device under test 200, which is a semiconductor switch. In the present embodiment, the device under test 200 is an isolated-gate bipolar transistor (IGBT).

The test apparatus 10 includes a main body 12 and a test head 13. The main body 12 performs overall control of the test apparatus 10. The test head 13 functions as a housing section that houses at least one test substrate 20. The test substrate 20 includes a circuit for testing the device under test 200. A performance board 14 on which the device under test 200 is mounted may be provided on top of the test head 13, for example.

The test head 13 includes an opening/closing section 15 that allows an operator to access the test substrate 20 within the test head 13. The opening/closing section 15 may be a structure for opening and closing a side surface of the housing section, for example. As another example, the opening/closing section 15 may have a structure for opening and closing the top of the housing section.

The test apparatus 10 may further include a housing section, also referred to as a fixture, provided between the device under test 200 and the test head 13 on top o the performance board 14. In this case, a portion of the test substrate 20 is housed within the fixture. The opening/closing section 15 opens and closes the fixture to allow the operator to access the test substrate 20.

The fixture may be provided separately from the test head 13, instead of on top of the test head 13. In this case, the test head 13 and the fixture are connected to each other by wiring, a probe, or a connector, for example.

The test head 13 further includes a locking section 16 that locks the opening/closing section 15 during testing, such that the opening/closing section 15 does not accidentally open, for example. The locking section 16 can prevent access to the test substrate 20 within the test head 13 during testing.

Figure 2:
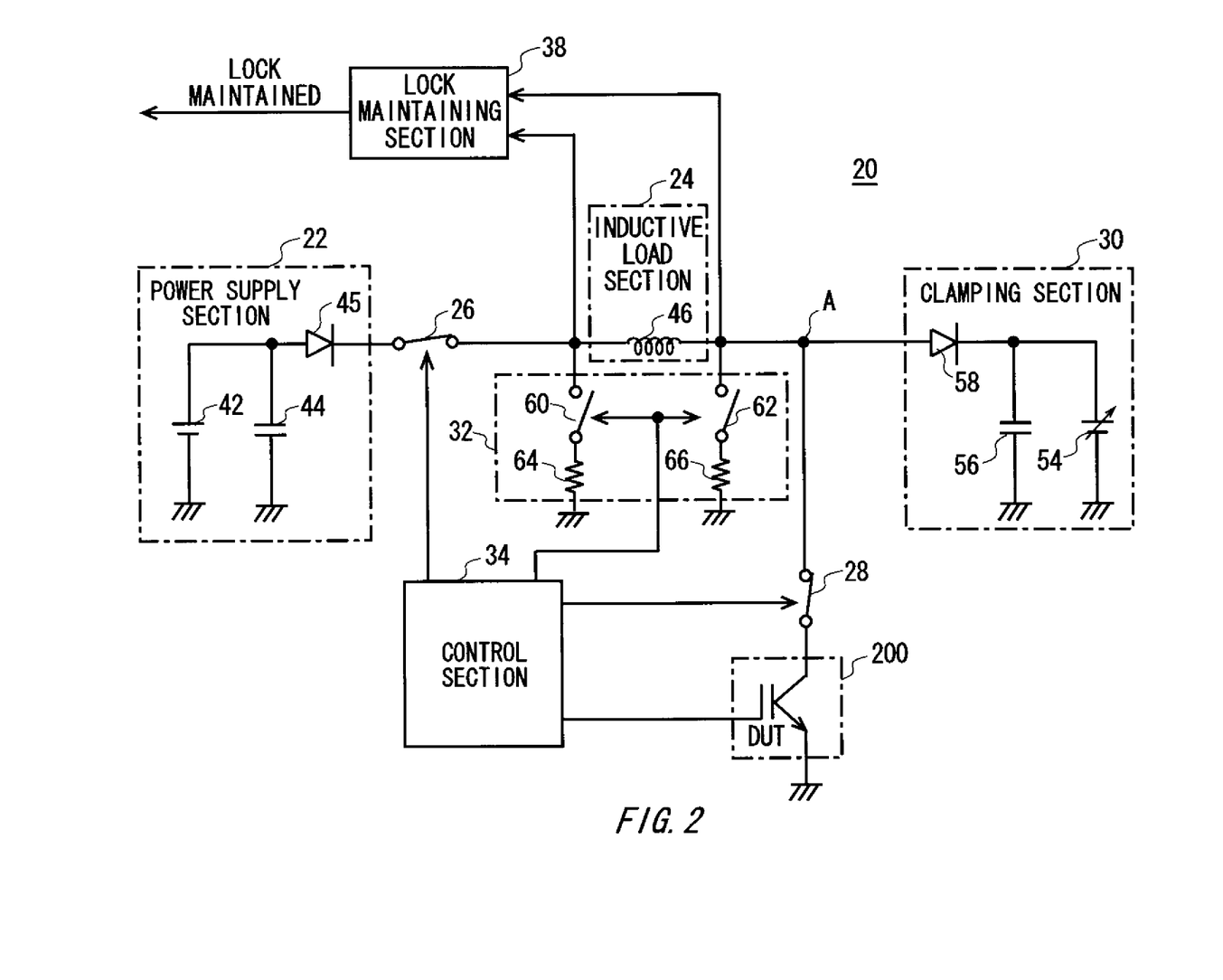
FIG. 2 shows the configuration of the test apparatus 10 according to the present embodiment, together with the device under test 200.

FIG. 2 shows the configuration of the test apparatus 10 according to the present embodiment, together with the device under test 200. The test apparatus 10 includes a power supply section 22, an inductive load section 24, a power supply switch 26, a cutoff switch 28, a clamping section 30, a discharge switch 32, a control section 34, and a lock maintaining section 38.

The power supply section 22 generates a power supply voltage to be supplied to the device under test 200. The power supply section 22 may generate a DC power supply voltage from 600 V to 2500 V, for example. In the present embodiment, the power supply section 22 applies the power supply voltage to the collector-emitter junction of the device under test 200, which is an IGBT. More specifically, the emitter of the device under test 200 is connected to a ground. The power supply section 22 applies a positive power supply voltage to the collector of the device under test 200.

The power supply section 22 may include a DC power supply section 42, a power supply capacitor 44, and a power supply diode 45. The negative terminal of the DC power supply section 42 is connected to the ground. The power supply capacitor 44 is connected between the ground and the positive terminal of the DC power supply section 42. The anode of the power supply diode 45 is connected to the positive terminal of the DC power supply section 42. The power supply section 22 generates the power supply voltage from the cathode of the power supply diode 45.

The inductive load section 24 has an inductance, and is provided in a path between the power supply section 22 and the device under test 200. The inductive load section 24 may be an inductor 46, for example. In the present embodiment, the inductive load section 24 is provided between the end of the power supply section 22 at which the power supply voltage is generated and the collector of the device under test 200, which is an IGBT.

The inductive load section 24 may include a plurality of inductors 46 with different inductances that are switched such that one inductor is connected to the path. In this way, the inductive load section 24 can provided an inductance corresponding to the testing content and the type of the device under test 200 in the path between the power supply section 22 and the device under test 200.

The power supply switch 26 provides a connection or a disconnection between the power supply section 22 and the inductive load section 24. The power supply switch 26 provides a connection between the power supply section 22 and the inductive load section 24 during testing, and disconnects the inductive load section 24 from the power supply section 22 when testing is not being performed. The power supply switch 26 may be a semiconductor switch such as a relay or an IGBT, for example.

The cutoff switch 28 is provided in the path between the inductive load section 24 and the device under test 200. In the present embodiment, the cutoff switch 28 is provided in the path between the terminal of the inductive load section 24 that is not connected to the power supply section 22 and the collector of the device under test 200, which is an IGBT. The cutoff switch 28 provides a connection between the inductive load section 24 and the device under test 200 during normal operation, and disconnects the device under test 200 from the inductive load section 24 when an abnormality occurs. The cutoff switch 28 may be a semiconductor switch such as an IGBT, for example.

The clamping section 30 limits the voltage of the path between the inductive load section 24 and the cutoff switch 28, namely a connection point A, to be within a preset range. In the present embodiment, the clamping section 30 controls the voltage of the path between the inductive load section 24 and the cutoff switch 28 such that this voltage does not exceed a predetermined clamp voltage that is higher than the power supply voltage, e.g. a voltage that is tens of percents higher than the power supply voltage.

The clamping section 30 may include a variable voltage source 54, a clamping capacitor 56, and a diode 58, for example. The negative terminal of the variable voltage source 54 is connected to the ground, and the variable voltage source 54 generates a clamp voltage set from the outside. The clamping capacitor 56 is connected between the ground and the positive terminal of the variable voltage source 54.

The anode of the diode 58 is connected to the connection point A, which is in the path between the inductive load section 24 and the cutoff switch 28, and the cathode of the diode 58 is connected to the positive terminal of the variable voltage source 54. When the potential of the connection point A becomes greater than or equal to the clamp voltage, the clamping section 30 turns ON the diode 58 and absorbs the current flowing through the connection point A. In this way, the clamping section 30 can limit the potential of the connection point A to be less than or equal to the clamp voltage.

When the testing is finished, the discharge switch 32 causes the energy accumulated in the inductive load section 24 to be discharged. For example, the discharge switch 32 may connect the ends of the inductive load section 24 to a predetermined reference potential, e.g. the ground potential, via a resistance load.

The discharge switch 32 may include a first switch 60, a second switch 62, a first resistor 64, and a second resistor 66. The first switch 60 provides a connection or a disconnection between the terminal of the inductive load section 24 on the power supply section 22 side and the ground potential, via the first resistor 64. The second switch 62 provides a connection or a disconnection between the terminal of the inductive load section 24 on the device under test 200 side and the ground potential, via the second resistor 66.

The control section 34 controls the power supply switch 26. More specifically, the control section 34 turns ON the power supply switch 26 when testing is begun, and turns OFF the power supply switch 26 when testing is finished. In this way, the control section 34 can supply the device under test 200 with the power supply power generated by the power supply section 22, via the inductive load section 24, during testing.

The control section 34 controls the device under test 200. In the present embodiment, the control section 34 supplies the gate voltage of the device under test 200, which is an IGBT, to turn the device under test 200 ON and OFF.

The control section 34 controls the cutoff switch 28. The control section 34 turns ON the cutoff switch 28 during normal operation. The control section 34 turns OFF the cutoff switch 28 when an abnormality occurs in the testing. In this way, the control section 34 can prevent voltage from being supplied to the device under test 200 when an abnormality occurs.

The control section 34 turns ON the discharge switch 32 when the testing is finished. In this way, the control section 34 can discharge the energy accumulated in the inductive load section 24 during testing. After the energy accumulated in the inductive load section 24 has been discharged, the control section 34 turns OFF the discharge switch 32.

The lock maintaining section 38 controls whether the opening/closing section 15, which is used to allow the operator access to the test substrate 20 in the test head 13 serving as the housing section, is kept in the locked state or can be unlocked. When the lock maintaining section 38 is in the locked state, the locking section 16 does not unlock even if the operator attempts to open the lock. When the lock maintaining section 38 allows the opening/closing section 15 to be unlocked, the locking section 16 is unlocked in response to the operator opening the lock.

When the voltage at a predetermined location in the test substrate 20 is greater than a set voltage, the lock maintaining section 38 keeps the opening/closing section 15 in the locked state. In other words, when the voltage at a predetermined location in the test substrate 20 is greater than the set voltage, the lock maintaining section 38 does not release the lock even if the operator attempts to open the opening/closing section 15. Therefore, when the voltage at a predetermined location in the test substrate 20 is greater than the set voltage, the lock maintaining section 38 can prevent the operator from accessing the test substrate 20 in the test head 13.

In the present embodiment, when the voltage at one end of the inductive load section 24 is greater than the set voltage, the lock maintaining section 38 keeps the opening/closing section 15 in the locked state. More specifically, when the voltage of the terminal of the inductive load section 24 on the power supply switch 26 side or the voltage of the terminal of the inductive load section 24 on the device under test 200 side is greater than the set voltage, the lock maintaining section 38 keeps the opening/closing section 15 in the locked state. In other words, when energy remains in the inductive load section 24, the lock maintaining section 38 keeps the opening/closing section 15 in the locked state. Therefore, the lock maintaining section 38 can prevent the operator from accessing the test substrate 20 including the inductive load section 24 while energy is still accumulated in the inductive load section 24.

When the voltage at a predetermined location of the test substrate 20 is greater than the set voltage, the lock maintaining section 38 may detect the voltage at the predetermined location once more after a prescribed time has passed, for example. In this way, the even while the locked state is being maintained, the lock maintaining section 38 can release the lock when the voltage at the predetermined location of the test substrate 20 becomes less than or equal to the set voltage after a prescribed time has passed.

The test apparatus 10 of the present embodiment may include a plurality of test substrates 20. In this case, the power supply section 22, the clamping section 30, and the lock maintaining section 38 may be provided in common for the plurality of test substrates 20.

Figure 3:
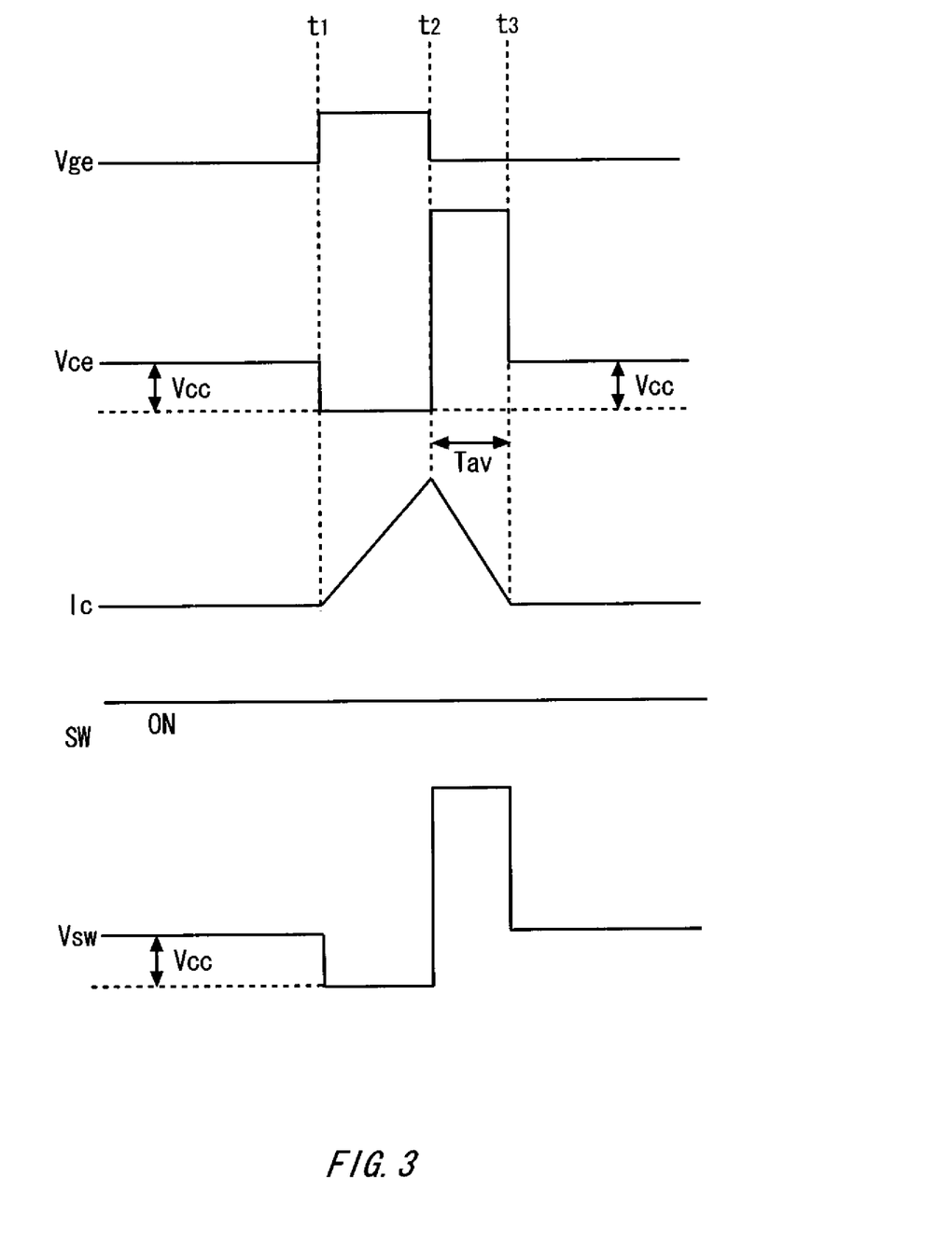
FIG. 3 shows exemplary waveforms of the gate voltage of the device under test 200, the collector-emitter voltage of the device under test 200, the collector current of the device under test 200, the control signal of the cutoff switch 28, and the voltage at the connection point A when the device under test 200 operates normally during testing of the avalanche breakdown voltage of the device under test 200, which his an IGBT.

FIG. 3 shows exemplary waveforms of the gate voltage of the device under test 200, the collector-emitter voltage of the device under test 200, the collector current of the device under test 200, the control signal of the cutoff switch 28, and the voltage at the connection point A when the device under test 200 operates normally during testing of the avalanche breakdown voltage of the device under test 200, which his an IGBT. In FIG. 3, Vge represents the gate voltage, i.e. the gate-emitter voltage, of the device under test 200, Vce represents the collector-emitter voltage of the device under test 200, Ic represents the collector current of the device under test 200, SW represents the waveform of the control signal of the cutoff switch 28, and Vsw represents the potential of connection point A, which is the path between the inductive load section 24 and the cutoff switch 28.

When testing the avalanche breakdown voltage of the device under test 200, which is an IGBT, first, the control section 34 turns OFF the device under test 200 and turns ON the power supply switch 26. Furthermore, since no abnormality is detected, the control section 34 turns ON the cutoff switch 28. After the device under test 200 is turned OFF and the power supply switch 26 is turned ON, the potential Vsw at the connection point A is the power supply voltage Vcc. The collector-emitter voltage Vce of the device under test 200 is also the power supply voltage Vcc.

The control section 34 keeps the power supply switch 26 turned ON. Furthermore, until an abnormality is detected, the control section 34 keeps the cutoff switch 28 turned ON.

Next, at the time t1, the control section 34 switches the device under test 200 from OFF to ON. After the device under test 200 is turned ON at the time t1, the collector-emitter voltage Vce of the device under test 200 becomes a voltage corresponding to the characteristics of the device under test 200. Furthermore, the potential Vsw at the connection point A becomes a voltage that is shifted from the collector-emitter voltage Vce by an amount equal to the ON voltage of the cutoff switch 28.

After the device under test 200 is turned ON at the time t1, the collector current Ic of the device under test 200 increases at a rate corresponding to the inductance of the inductive load section 24. Energy is accumulated in the inductive load section 24 due to the power supplied from the power supply section 22.

Next, at the time t2, which is a predetermined time after the time t1, the control section 34 switches the device under test 200 from ON to OFF. When the device under test 200 is switched from ON to OFF, the current flowing through the inductive load section 24 is stopped and the inductive load section 24 generates a back electromotive force. Accordingly, after the device under test 200 is turned OFF at the time t2, the potential Vsw at the connection point A increases to a voltage obtained as the sum of the power supply potential Vcc generated from the power supply section 22 and a voltage corresponding to the back electromotive force of the inductive load section 24.

After the device under test 200 is turned OFF at the time t2, the inductive load section 24 discharges the energy accumulated from the time t1 to the time t2 as a current. The device under test 200 absorbs the current discharged from the inductive load section 24, as a result of the collector current Ic flowing.

Accordingly, after the device under test 200 is turned OFF at the time t2, the device under test 200 causes the collector current Ic to flow until all of the energy accumulated in the inductive load section 24 is discharged. The collector current Ic decreases at a rate corresponding to the inductance of the inductive load section 24. The period during which the energy accumulated in the inductive load section 24 is discharged as current is referred to as the avalanche period Tav.

Next, when all of the energy accumulated in the inductive load section 24 has been discharged (time t3), the collector current Ic becomes 0. Since the back electromotive force generated by the inductive load section 24 is also 0, the potential Vsw at the connection point A becomes the power supply voltage Vcc. Furthermore, the collector-emitter voltage Vice of the device under test 200 also becomes the power supply voltage Vcc.

The test apparatus 10 controls the device under test 200 in the manner described above during testing of the avalanche breakdown voltage. When the above operation is performed normally, i.e. when the device under test 200 does not break down due to an excessive current flowing therethrough, the test apparatus 10 judges the device under test 200 to be nondefective.

Figure 4:
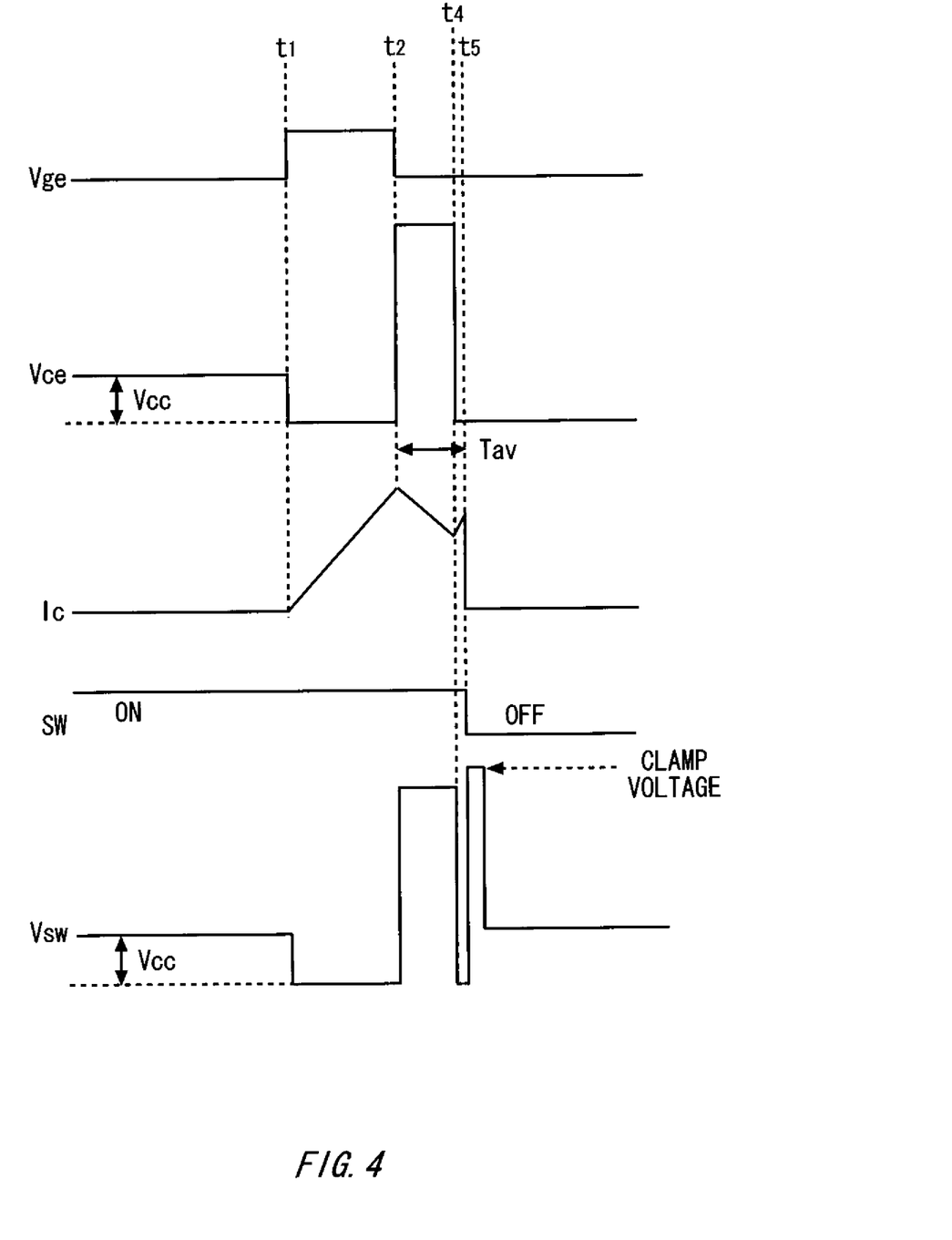
FIG. 4 shows exemplary waveforms of the gate voltage, the collector-emitter voltage, and the collector current of the device under test 200, the control signal of the cutoff switch 28, and the voltage of the connection point A when the device under test 200 is operating abnormally during testing of the avalanche breakdown voltage of the device under test 200, which is an IGBT.

FIG. 4 shows exemplary waveforms of the gate voltage, the collector-emitter voltage, and the collector current of the device under test 200, the control signal of the cutoff switch 28, and the voltage of the connection point A when the device under test 200 is operating abnormally during testing of the avalanche breakdown voltage of the device under test 200, which is an IGBT. In FIG. 4, Vge, Vice, Ic, SW, and Vsw represent the same waveforms as in FIG. 3.

Here, it is assumed that the device under test 200 malfunctions during testing. In this case, an abnormality occurs in the operation of the device under test 200.

For example, it may be assumed that the device under test 200 malfunctions in the short-circuit mode at the time t4 during the avalanche period Tav. In this case, the collector current Ic increases quickly. Furthermore, the potential Vsw at the connection point A drops due to the short circuiting of the device under test 200.

If the device under test 200 malfunctions in this way, when the collector current Ic continues flowing to the device under test 200, there is a high chance that the increase of the collector current Ic will cause the device under test 200 to break down. In such a case, the control section 34 switches the cutoff switch 28 from ON to OFF (time t5).

Therefore, when the device under test 200 malfunctions in this way, the control section 34 can stop the collector current Ic from quickly flowing to the device under test 200. At this time, the potential Vsw of the connection point A increases due to the back electromotive force of the inductive load section 24, but this increase is limited by the clamp voltage. After a certain time has passed, the potential Vsw of the connection point A drops to the power supply voltage Vcc.

In this way, the test apparatus 10 can prevent excessive current from causing the breakdown of the device under test 200 or the test apparatus 10 itself when testing the avalanche breakdown voltage of the device under test 200, which is an IGBT.

Figure 5:
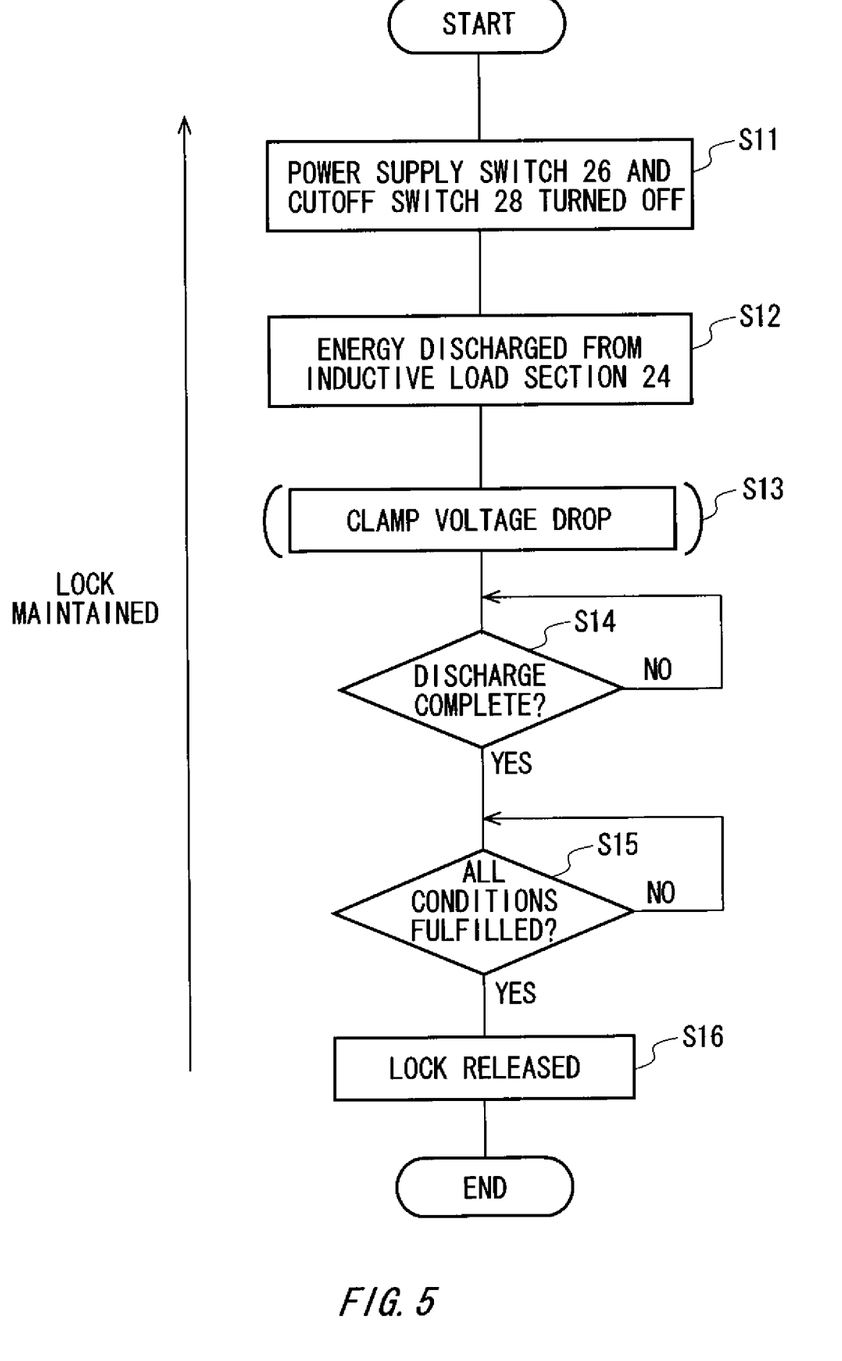
FIG. 5 shows a process flow performed after the end of the testing by the test apparatus 10 according to the present embodiment.

FIG. 5 shows a process flow performed after the end of the testing by the test apparatus 10 according to the present embodiment. After testing is finished, the test apparatus 10 performs the processes shown in FIG. 5 from step S11 to step S16.

At the moment when the testing is finished, the lock maintaining section 38 of the test apparatus 10 is keeping the opening/closing section 15 in the locked state. When the testing is finished, first, the control section 34 of the test apparatus 10 turns OFF the power supply switch 26 and the cutoff switch 28 (S11). In this way, the control section 34 can stop new accumulation of energy in the inductive load section 24.

Next, the control section 34 of the test apparatus 10 discharges the energy accumulated in the inductive load section 24 (S12). For example, the control section 34 may use the discharge switch 32 to connect both ends of the inductive load section 24 to the ground potential via a resistance load, thereby discharging the energy accumulated in the inductive load section 24.

Next, the control section 34 of the test apparatus 10 changes the clamp voltage to be less than or equal to a predetermined potential (S13). The test apparatus 10 does not necessarily need to perform the process of step S13.

Next, the lock maintaining section 38 of the test apparatus 10 judges whether the energy accumulated in the inductive load section 24 has been discharged (S14). In the present embodiment, the lock maintaining section 38 determines whether the voltage at one of the ends of the inductive load section 24 is greater than a set voltage. When the voltage at one of the ends of the inductive load section 24 is greater than the set voltage, the lock maintaining section 38 determines that energy still remains, and keeps the opening/closing section 15 in the locked state.

The lock maintaining section 38 periodically makes the determination of whether the voltage at one of the ends of the inductive load section 24 is greater than the set voltage. When the voltage at one of the ends of the inductive load section 24 is less than or equal to the set voltage, the lock maintaining section 38 performs the following process.

The lock maintaining section 38 determines whether all of the conditions for releasing the opening/closing section 15 from the locked state have been fulfilled (S15). If there are conditions that are not fulfilled, the lock maintaining section 38 postpones the processing of step S15 and keeps the opening/closing section 15 in the locked state. When all of the conditions have been fulfilled, the process proceeds to step S16 and the lock maintaining section 38 causes the opening/closing section 15 to be unlockable.

In the manner described above, the test apparatus 10 can keep the opening/closing section 15 in the locked state until the energy accumulated in the inductive load section 24 has been discharged, even after the testing is finished. As a result, the test apparatus 10 can easily and reliably detect whether the energy accumulated in the inductive load section 24 has been discharged, and can keep the opening/closing section 15 locked to prevent the operator from accessing the test substrate 20 while energy is still accumulated in the inductive load section 24.

One of the conditions for the lock maintaining section 38 making the opening/closing section 15 unlockable may be that the clamp voltage of the clamping section 30 is less than or equal to a predetermined voltage, for example. In this case, the lock maintaining section 38 keeps the opening/closing section 15 in the locked state when the clamp voltage of the clamping section 30 is greater than the predetermined voltage, for example. The lock maintaining section 38 causes the opening/closing section 15 to be unlockable on the condition that the clamp voltage of the clamping section 30 is less than or equal to the predetermined voltage. In this way, the lock maintaining section 38 can prevent the operator from accessing the test substrate 20 on the condition that the clamp voltage has definitely dropped. Furthermore, in a similar manner, the lock maintaining section 38 may use the power supply voltage output from the power supply section 22 as one of the conditions for making the opening/closing section 15 unlockable. In this case, the lock maintaining section 38 keeps the opening/closing section 15 in the locked state when the power supply voltage is greater than the predetermined voltage, for example.

When testing a plurality of devices under test 200 in parallel, the lock maintaining section 38 may use, as one of the conditions for making the opening/closing section 15 unlockable, whether the energy has been discharged from all of the inductive load sections 24 corresponding to the devices under test 200. In this case, the lock maintaining section 38 keeps the opening/closing section 15 in the locked state when the voltage at one of the ends of at least one of the inductive load sections 24 is higher than the set voltage. As a result, the lock maintaining section 38 can allow the operator to access the test substrate 20 on a condition that the energy has been discharged from all of the inductive load sections 24.

Figure 6:
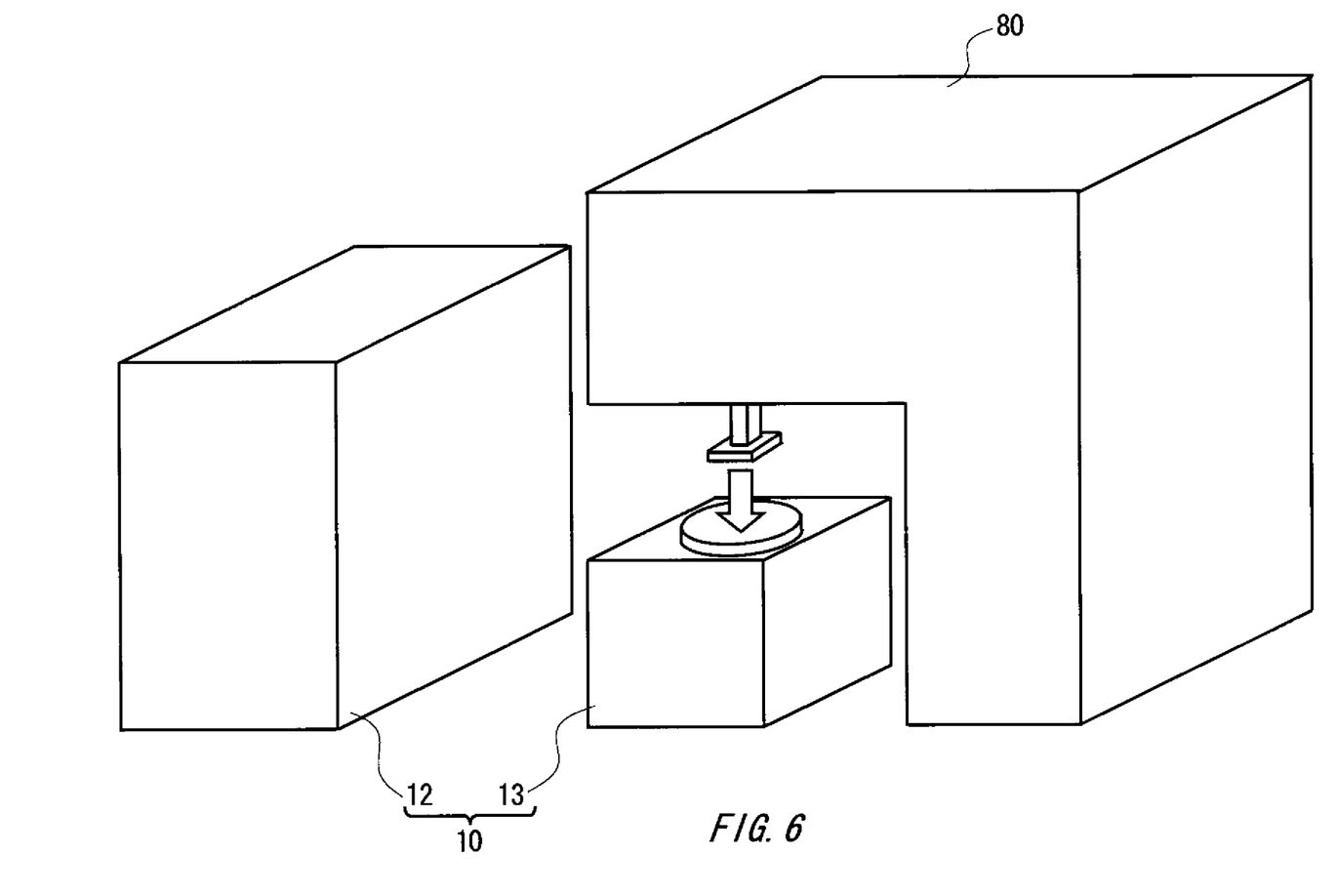
FIG. 6 shows an exemplary external configuration of the test apparatus 10 according to a modification of the present embodiment.

FIG. 6 shows an exemplary external configuration of the test apparatus 10 according to a modification of the present embodiment. The test apparatus 10 of the present embodiment adopts substantially the same function and configuration as the test apparatus 10 described in relation to FIGS. 1 to 5, and therefore the following description includes only differing points.

The test apparatus 10 of the present modification is accessed by a handler apparatus 80. The handler apparatus 80 acquires a device under test 200 that has yet to be tested from a cartridge, for example, and transports this device under test 200 to the test apparatus 10. The handler apparatus 80 removes a tested device under test 200 from the test apparatus 10 and transports the tested device under test 200 to the cartridge.

In the present modification, the lock maintaining section 38 controls whether the handler apparatus 80 is permitted to access the test apparatus 10. When the voltage at a predetermined location on the test substrate 20, e.g. the voltage at the ends of the inductive load section 24, is higher than a set voltage, the lock maintaining section 38 prevents the handler apparatus 80 from accessing the test apparatus 10. Therefore, with the test apparatus 10 of the present modification, the lock maintaining section 38 can allow the handler apparatus 80 to access the device under test 200 at least after the energy of the inductive load section 24 has been discharged.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus that tests a device under test, comprising:
    a power supply section that generates a power supply voltage to be supplied to the device under test;
    an inductive load section that is provided in a path between the power supply section and the device under test;
    a housing section that houses a substrate that includes at least the inductive load section;
    a lock maintaining section that keeps an opening/closing section, which allows an operator to access the substrate within the housing section, in a locked state when a voltage at a predetermined position on the substrate is greater than a set voltage, wherein the lock maintaining section keeps the opening/closing section in the locked state when there is energy remaining in the inductive load section; and
    a discharge switch that discharges energy accumulated in the inductive load section after testing is finished.

2. The test apparatus according to claim 1, wherein the lock maintaining section keeps the opening/closing section in the locked state when the voltage at one end of the inductive load section is greater than the set voltage.

3. The test apparatus according to claim 1, wherein the discharge switch connects each end of the inductive load section to a predetermined reference potential.

4. The test apparatus according to claim 1, further comprising a clamping section that limits voltage applied to the device under test to be within a predetermined range, wherein the lock maintaining section keeps the opening/closing section in the locked state when voltage of the clamping section is greater than a predetermined voltage.

5. The test apparatus according to claim 1, wherein when the voltage at a predetermined location on the substrate is greater than the set voltage, the lock maintaining section detects the voltage at the predetermined location again after a prescribed time has passed.

6. The test apparatus according to claim 1, wherein the lock maintaining section prohibits a handler apparatus, which transports the device under test to the test apparatus, from accessing the test apparatus when the voltage at a predetermined location on the substrate is greater than the set voltage.

7. The test apparatus according to claim 1, further comprising a power supply switch provided between the power supply section and the inductive load section.

8. The test apparatus according to claim 1, wherein the device under test is an insulated-gate bipolar transistor.

9. A test apparatus that tests a device under test, comprising:
    a power supply section that generates a power supply voltage to be supplied to the device under test;
    an inductive load section that is provided in a path between the power supply section and the device under test;
    a housing section that houses a substrate that includes at least the inductive load section;
    a clamping section that limits voltage applied to the device under test to be within a predetermined range; and
    a lock maintaining section that keeps an opening/closing section, which allows an operator to access the substrate within the housing section, in a locked state when a voltage at a predetermined position on the substrate is greater than a set voltage, wherein the lock maintaining section keeps the opening/closing section in the locked state when voltage of the clamping section is greater than a predetermined voltage.

10. The test apparatus according to claim 9, wherein the lock maintaining section keeps the opening/closing section in the locked state when the voltage at one end of the inductive load section is greater than the set voltage.

11. The test apparatus according to claim 9, further comprising a discharge switch that discharges energy accumulated in the inductive load section after testing is finished, wherein the lock maintaining section keeps the opening/closing section in the locked state when there is energy remaining in the inductive load section.

12. The test apparatus according to claim 11, wherein the discharge switch connects each end of the inductive load section to a predetermined reference potential.

13. The test apparatus according to claim 9, wherein when the voltage at a predetermined location on the substrate is greater than the set voltage, the lock maintaining section detects the voltage at the predetermined location again after a prescribed time has passed.

14. The test apparatus according to claim 9, wherein the lock maintaining section prohibits a handler apparatus, which transports the device under test to the test apparatus, from accessing the test apparatus when the voltage at a predetermined location on the substrate is greater than the set voltage.

15. The test apparatus according to claim 9, further comprising a power supply switch provided between the power supply section and the inductive load section.

16. The test apparatus according to claim 9, wherein the device under test is an insulated-gate bipolar transistor.

* * * * *